US007428188B2

(12) United States Patent
Duke

(10) Patent No.: US 7,428,188 B2

(45) Date of Patent: Sep. 23, 2008

(54) METHOD FOR GENERATING A CUE DELAY CIRCUIT

(75) Inventor: Ronald J. Duke, Centerville, OH (US)

(73) Assignee: Eastman Kodak Company, Rochester, NY (US)

( * ) Notice: Subject to any disclaimer, the term of this patent is extended or adjusted under 35 U.S.C. 154(b) by 536 days.

(21) Appl. No.: 11/113,595

(22) Filed: Apr. 25, 2005

(65) Prior Publication Data

US 2006/0056245 A1 Mar. 16, 2006

Related U.S. Application Data

(63) Continuation-in-part of application No. 10/942,440, filed on Sep. 15, 2004, now Pat. No. 6,912,179.

(51) Int. Cl.

| | |
|---|---|
| ***G04B 47/00*** | (2006.01) |
| ***B41J 29/38*** | (2006.01) |
| ***B41J 2/00*** | (2006.01) |
| ***G11C 7/00*** | (2006.01) |

(52) U.S. Cl. .................. 368/10; 347/5; 347/9; 365/194

(58) Field of Classification Search .................. 368/10, 368/108; 347/5, 9, 20; 348/148; 358/1.15, 358/1.16; 365/194, 195

See application file for complete search history.

(56) References Cited

U.S. PATENT DOCUMENTS

| | | | | |
|---|---|---|---|---|
| 4,045,136 | A | 8/1977 | Watson et al. | |
| 4,072,419 | A * | 2/1978 | Watson | 355/83 |
| 4,860,219 | A | 8/1989 | Schulz et al. | |
| 5,557,304 | A | 9/1996 | Stortz | |
| 6,109,732 | A | 8/2000 | Wen | |
| 6,241,334 | B1 * | 6/2001 | Haselby | 347/19 |
| 6,559,962 | B1 | 5/2003 | Fukunaga et al. | |
| 6,803,989 | B2 | 10/2004 | Silverbrook | |
| 2004/0183842 | A1 * | 9/2004 | Kobayashi et al. | 347/10 |

OTHER PUBLICATIONS

Pending U.S. Appl. No. 10/948,071, entitled Varying Cue Delay Circuit, filed Sep. 23, 2004 in the name of Ronald J. Duke and assigned to Eastman Kodak Company.

* cited by examiner

*Primary Examiner*—Vit W Miska
(74) *Attorney, Agent, or Firm*—Buskop Law Group PC

(57) ABSTRACT

A method for generating a delayed cue signal begins by receiving a tachometer input and writing a cue signal to a write address into a memory element that includes a read address. A memory output signal is read from the read address and a delayed cue signal is created from the memory output signal. Next, a cue delay value is created, wherein the cue delay value is the difference between the read address and the write address. The method ends by generating the delayed cue signal from the cue delay value.

17 Claims, 2 Drawing Sheets

METHOD FOR GENERATING A CUE DELAY CIRCUIT

CROSS REFERENCE TO RELATED APPLICATIONS

This application is a continuation-in-part of U.S. application Ser. No. 10/942,440, entitled "CUE DELAY CIRCUIT," filed Sep. 15, 2004, now U.S. Pat. No. 6,912,179, in the name of Ronald J. Duke and assigned to Eastman Kodak Company.

Reference is made to pending U.S. application Ser. No. 10/948,071, entitled VARYING CUE DELAY CIRCUIT, filed Sep. 23, 2004 in the name of Ronald J. Duke and assigned to Eastman Kodak Company.

FIELD OF THE INVENTION

The present embodiments relates to methods for generating a delayed cue signal.

BACKGROUND OF THE INVENTION

The digital printing industry has need for properly positioning data and printing information on print media. To accommodate the need for time to process the new data for proper insertion on the paper, the need for cue delays has arisen. Also, there is a need to control various peripheral devices simultaneously with printing and a cue delay has been become an easy fix to enable smooth incorporation of these devices with the printer.

So far, the cue delay systems have been cumbersome, slow, and inaccurate.

A need exists for a fast, instantaneous system which provides smooth, efficient operation of the printer while incorporating new information.

The need for such cue delay circuits is compounded on printing systems that employ a plurality of print heads which print on the print media sequentially. It is important to have separate cue delay signals so that each of the print heads can output properly when registered with an adjacent printhead.

Traditionally, the cues are highly programmable and it has been impossible to have a standard cue delay as each print job is different. Accordingly, the present invention provides the flexibility needed to provide a cue delay for different size jobs, different combinations of print heads, and for different types of print media.

The present embodiments described herein were designed to meet these needs.

SUMMARY OF THE INVENTION

A method for generating a delayed cue signal entails receiving a tachometer input and writing the cue signal to a write address located in a memory element. The memory element includes a read address. The method continues by reading a memory output signal from the read address. If data has been previously written to the read address, a delayed cue signal is created from the memory output signal. A cue delay value is created by taking the difference between the read address and the write address. The method ends by generating the delayed cue signal from the cue delay value.

A cue delay circuit for an ink jet printing system usable with the embodied methods includes a memory element and a sequence circuit adapted to control the timing associated with reading and writing from the memory element. The cue delay circuit includes a first circuitry group adapted to create a write and a read address. A second circuitry group in the cue delay circuit is used to verify the read address has been written to.

BRIEF DESCRIPTION OF THE DRAWINGS

In the detailed description of the preferred embodiments presented below, reference is made to the accompanying drawings, in which.

Figure 1:
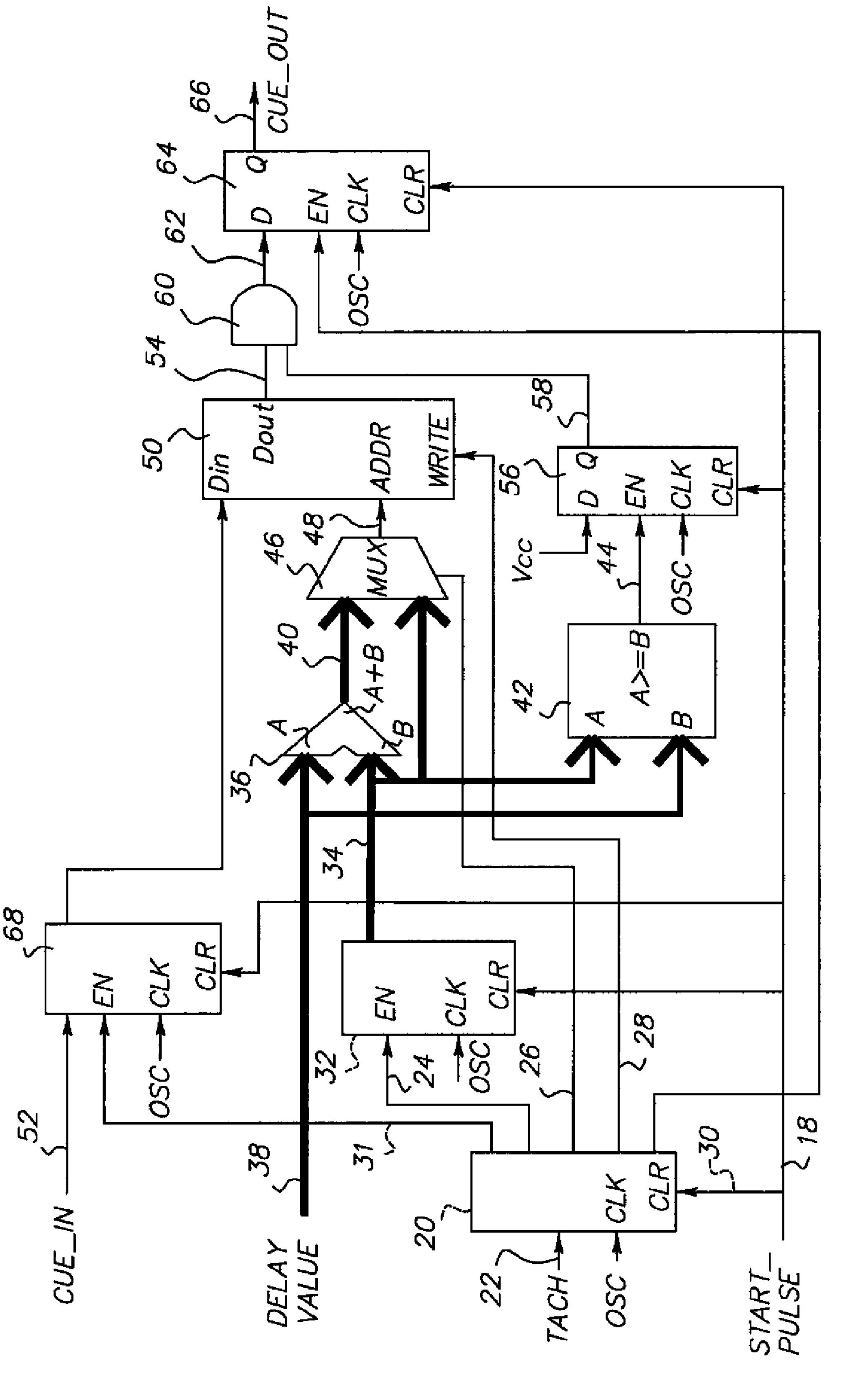
FIG. 1 is an example of an integrated circuit for an ink jet printer.

The present embodiments are detailed below with reference to the listed Figures.

DETAILED DESCRIPTION OF THE INVENTION

Before explaining the present embodiments in detail, it is to be understood that the embodiments are not limited to the particular descriptions and that it can be practiced or carried out in various ways.

A key benefit of the present integrated circuits and methods is that the need to write out all prior memory cue locations in the memory of an ink jet printhead to zero is eliminated, thereby saving significant amounts of time and additional logic circuits. The instant cue delay incorporated in the embodiments herein enable printers to restart immediately after stopping by not having to zero out the memory element. The printer simply starts with a new delay value, thereby providing a more efficient systems than those systems known in the prior art.

Safety is improved using the embodied integrated circuits since all cues are proper and accounted, particularly for page correlation systems. Reliability for compiling a multicolor document printed by a number of printheads is increased using the embodied integrated circuits because the printheads do not have to be properly aligned off the same document.

A method for generating a delayed cue signal entails receiving a tachometer input. Prior to receiving the tachometer input, the read address and/or the write address can be set to a default value. Typically, the default value is zero, but the default can be any value used as a starting value. The write address can be greater than, less than, or equal to the read address. The read address and/or, the write address can be incremented or decremented a specific value for each additional tachometer input. The preferred value to increment or decrement the addresses by is one, but any constant value can be used.

A cue signal is written to the write address in a memory element. The memory element includes a read address. The memory element can be random access memory (RAM), first in-first out memory (FIFO), first in-last out memory (LIFO), a circular buffer, a register in an FPGA, or combinations thereof.

Prior to writing the cue signal to the write address, the method can include the step of retrieving a cue delay value.

The method continues by reading a memory output signal from the read address. If the read address has previously been written to, a delayed cue signal is created from the memory output signal. A cue delay value is created, wherein the cue delay value is the difference between the read address and the write address. The cue delay value is greater than or equal to zero.

The embodied methods provide the novel aspect of receiving a desired cue delay value, comparing the desired cue delay value with the cue delay value currently being used, and, then incrementing or decrementing the cue delay value by one to reduce the difference between the cue delay value and the desired cue delay value.

The method ends by generating the delayed cue signal from the cue delay value.

With reference to the figures, FIG. 1 depicts an example integrated circuit for an ink jet printer. The embodied methods can be implemented on an integrated circuit similar to the circuit depict in FIG. 1 and described herein. The embodied integrated circuit contains a state machine 20 with numerous sequenced logic circuits adapted to receive a start pulse 18. The start pulse 18 initializes the state machine 20. The state machine 20 receives a tachometer input 22 and generates numerous buffered control signals 24, 26, 28, and 30 from the tachometer input 22.

The integrated circuit includes a counter 32 with numerous sequenced logic circuits to count one of the buffered control signals 24 from the state machine 20 before forming a read address 34.

Continuing with FIG. 1, an adder 36 receives the read address 34 and the cue delay value 38. The adder 36 adds the read address 34 to the cue delay value 38 and generates a write address 40.

A comparator 42 compares the cue delay value 38 to the read address 34. If the read address 34 is greater than the cue delay value 38, the comparator 42 forms a comparator output 44.

A multiplexer (MUX) 46 receives the read address 34, the write address 40, and one of the buffered control signals 26. The multiplexer (MUX) 46 then forms a multiplexer output 48 based upon the inputs. A memory element 51 receives the multiplexer output 48. The memory element 51 can be read-access memory (RAM) or random-access memory. The multiplexer output 48 serves as a memory address. The cue signal 52 and one of the buffered control signals 28 serve as a write/read control for the memory to provide a memory output signal 54.

The embodied integrated circuits include one or more flip flops 56 that latch to the comparator output 58, thereby forming a latched comparator output 64. An example of a flip flop 56 is a synchronous D flip flop with a chip enabler and a reset.

In an alternative embodiment, the embodied integrated circuits can include a cue pulse conditioning circuit 68. The cue pulse conditioning circuit 68 modifies the cue signal 52 by latching the cue signal 52 and synchronizing the transmission of the cue signal 52 with a buffered control signal. The cue pulse conditioning circuit 68 can further include numerous gates and flip flops.

Returning to FIG. 1, the embodied integrated circuit includes a gate circuit 60 and a logic circuit 64. The gate circuit 60 receives the latched comparator output 58 and the memory output signal 54. The gate circuit 60 uses the inputs to form a gated cue signal 62. The logic circuit 64 receives one of the buffered control signals 30 and the gated cue signal 62. The logic circuit 64 outputs a delayed cue signal 66 to the printing system.

In an alternative embodiment, the embodied integrated circuits can include an oscillator in communication the state machine 20, the counter 32, one or more flip flops 56, and the logic circuit 64.

An alternative embodiment of a cue delay circuit for an ink jet printing system usable with the methods includes a memory element 51, a sequence circuit, a first circuitry group 200, and a second circuitry group 202.

For each pulse received at the tachometer input 22, the cue signal level is stored in the memory element 51, so that the cue signal level can be retrieved after the appropriate cue delay.

The write and read addresses used for storing and retrieving the cue signal level in memory 51 are produced by a first circuitry group 200. The first circuitry group 200 can include an adder 36 to create a difference between the write address 40 and the read address 34; a multiplexer 46 to switch between the read address 34 and the write address 40; and a counter 32. In the embodiment shown in the figure, the adder 36 adds the cue delay value 38 to the read address 34, thereby making the write address 40 larger than the read address 34. As each pulse is received at the tachometer input 22, the counter 32 increments the read address 34 through the adder 36 and the write address 40. Typically, the counter 32 increments by one for each received pulse, but other increment amounts are possible. As the read address 34 and the write address 40 differ by the cue delay value 38, the cue signal 52 levels stored in the memory are subsequently retrieved once the read address 34 has been incremented by an amount equal to the cue delay value 38.

In the embodiment shown in FIG. 1, the adder 36 adds the cue delay value 38 to the read address 34 to create a write address 40; however, other configurations that cause the read and write addresses to differ by the cue delay value 38 can be employed. For example, the output of the counter 32 can be used as a write address and the cue delay value 38 can be subtracted from the output to create a read address 34. For such an embodiment, the write address 40 is larger than the read address 34 by the cue delay value 38. In these embodiments, the counter 32 output is increased or incremented as pulses are received at the tachometer input 22. Alternative embodiments entail the counter output being decremented or reduced as pulses are received at the tachometer input 22. For such embodiments, the read address 34 is larger than the write address 40 by an amount equal to the cue delay value 38.

The first circuitry group 200 can include circuitry groups to retrieve the cue delay value 38 prior to writing the cue signal to the write address 40. The retrieved cue delay value is called a desired cue delay value. Such circuitry groups can include circuitry to compare a desired cue delay with the current cue delay value. The circuitry groups can further increment the current cue delay toward the desired cue delay with each pulse received on the tachometer input 22. This additional circuitry enables the cue delay value to be changed while continuing to print without the risk of passing over cue signal pulses stored in memory element 51.

When the cue delay circuit is initiated with the counter 32 output reset to zero, the memory output signal 54 should not produce undesirable delayed cue pulses as a result of residual data left in the memory element from the previous operation. A second circuitry group 202 carries out the function of verifying that read address has been written to. The second circuitry group 202 further carries out the function of disabling the outputting of a delayed cue signal if the read address has not been written to. The second circuitry group 202 can include a comparator 42, a flip flop 56, and a gate circuit 60. In the embodiment shown in the figure, the memory output signal 54 is initially gated or blocked by gate 60. Once the read address 34 exceeds the delay value 38, the comparator output 44 and the latched comparator value 58 go high, thereby enabling the gate 60 to produce the gated cue signal 62. A logic circuit 64 can then be employed to condition the gated cue delay 62 to produce a delayed cue signal 66. In an alternate embodiment, the second circuitry group can disable the reading from the memory element 51 if the read address has not been written to, rather than gating the output of the memory element 51 to disable the outputting of a delayed cue signal.

The cue delay circuit further includes a sequence circuit. The sequence circuit controls the timing associated with reading and writing from the memory element 51 and with the timing associated with the first and second circuitry groups 200 and 202. The sequence circuit can include a state machine 20, a binary counter, a shift register, a microcontroller, a mono-stable delay circuit, or combinations thereof.

Figure 2:
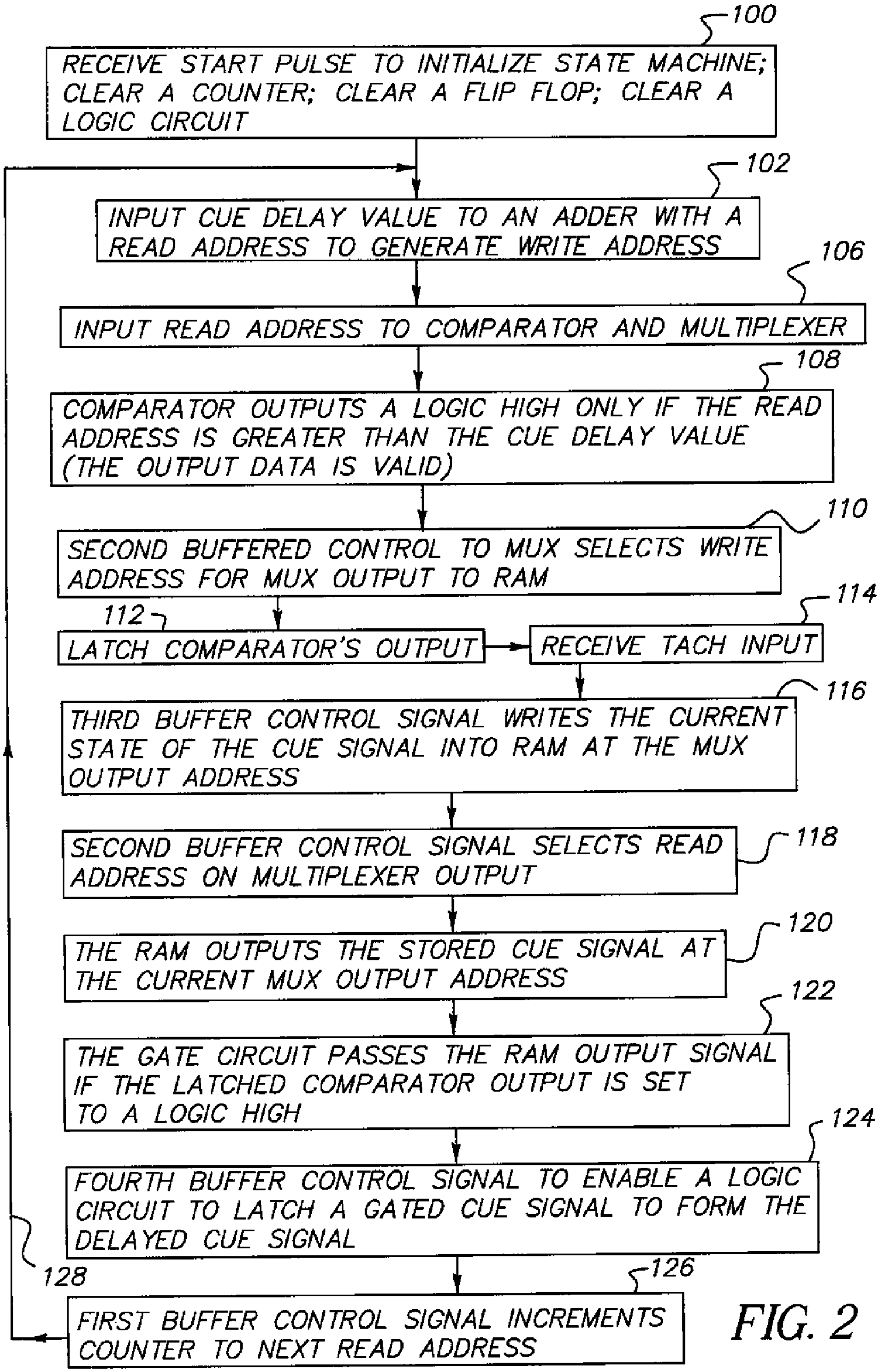
FIG. 2 is a flow diagram of a preferred method for use of the cue delay circuit.

FIG. 2 depicts a schematic for a method of using the embodied integrated circuit in an ink jet printing system. The method begins by sending a start pulse to initialize a state machine (Step 100). The initializing step entails clearing the counter, a flip flop, and a logic circuit. The counter is cleared and a read address is set to zero. The flip flop is cleared to set a latch comparator output to zero. The logic circuit is cleared to set the delayed cue signal to zero. Concurrently, a cue delay value and the read address from the counter are input to an adder to generate a write address (Step 102). The write address is supplied to a multiplexer along with the read address from the counter.

The methods continue by inputting a first buffered control signal from the state machine to a counter in order to increment a read address by one (Step 104). The read address is then input into the comparator and a multiplexer (Step 106). While inputting the cue delay value to the adder, the cue delay value is input to a comparator to set the comparator output to a logic high value if the read address is greater than the cue delay value (Step 108).

A second buffered control signal from the state machine causes the multiplexer to provide the write address to a memory element. The second buffered control signal provides a multiplexer output that is equal the value of the write address (Step 110). The comparator output is latched using a gate circuit (Step 112). A tachometer input is entered into the state machine (Step 114).

The next steps in the methods entail inputting a cue signal to a memory element and inputting a third buffered control signal from the state machine to the memory element (Step 116). The third buffered control signal causes the current state of the cue signal to be written to the address of the memory element and causes the current state of the cue signal to correspond to the write address received from the multiplexer. The second buffered control signal from the state machine works in conjunction with the third buffered control signal to cause the output of the multiplexer to equal the value of the read address (Step 118).

The memory output is sent to the gate circuit (Step 120) and the gated cue signal is passed to a logic circuit if the latched comparator output is set to logic high (Step 122). A fourth buffered control signal from the state machine enables the logic circuit to latch the gated cue signal to form the delayed cue signal (Step 124). The delayed cue signal is then transmitted to the ink jet printing system (Step 126).

The steps following the initializing step are repeated until a new start pulse is received by the state machine (Step 128).

In an alternative embodiment, the methods include a step of pulsing one or more buffered control signals.

In still another embodiment, the methods can optionally include the step of employing a cue pulse conditioner to latch the cue signal until the cue signal can be written to the memory element. If a cue pulse conditioner is used, a start pulse can be used to initialize a cue pulse conditioning circuit.

The embodiments have been described in detail with particular reference to certain preferred embodiments thereof, but it will be understood that variations and modifications can be effected within the scope of the embodiments, especially to those skilled in the art.

PARTS LIST

18. start pulse
20. state machine
22. tachometer input
24. first buffered control signal
26. second buffered control signal
28. third buffered control signal
30. fourth buffered control signal
31. fifth buffered control signal
32. counter
34. read address
36. adder
38. cue delay value
40. write address
42. comparator
44. comparator output
46. multiplexer (MUX)
48. multiplexer output
51. memory element
52. cue signal
54. memory output signal
56. plurality of flip flops
58. latched comparator output
60. gate circuit
62. gated cue signal
64. logic circuit
66. delayed cue signal
68. cue pulse conditioning circuit
200. first circuitry group
202. second circuitry group

The invention claimed is:

1. A method for generating a delayed cue signal (66) that is delayed relative to a cue signal (52) by a cue delay value (38) comprising:

a. receiving a tachometer input (22);
b. creating a write address (40);
c. creating a read address (34) that differs from the write address (40) by the cue delay value (38);
d. writing a cue signal (52) to a write address (40) into a memory element (51);
e. verifying that the read address (34) of the memory element (51) has previously been written to;
f. reading a memory output signal (54) from the read address (34) of the memory element (51); and
g. creating a delayed cue signal (66) from the memory output signal (54).

2. The method of claim 1, wherein the step of creating the delayed cue signal from the memory output signal is performed only if the read address of the memory element has been written to.

3. The method of claim 1, wherein the step of creating the delayed cue signal from the memory output signal is performed by gating the output of from the memory element.

4. The method of claim 1, wherein the step of creating the delayed cue signal from the memory output signal is performed by disabling the reading from the memory if the read address has not been written to.

5. The method of claim 1, wherein the cue delay value is greater than or equal to zero.

6. The method of claim 1, wherein the read address, the write address or combination thereof is incremented by a value of one for each additional tachometer input.

7. The method of claim 6, wherein the write address is greater than or equal to the read address.

8. The method of claim 1, wherein the read address, the write address or combination thereof is decremented by a value of one for each additional tachometer input.

9. The method of claim 8, wherein the write address is less than or equal to the read address.

10. The method of claim 1, further comprising the step of retrieving a cue delay value prior to writing the cue signal to the write address.

11. The method of claim 1, wherein the memory element is selected from the group consisting of a random access memory (RAM), a first in-first out memory (FIFO), a first in-last out memory (LIFO), a circular buffer, a register in an FPGA, and combinations thereof.

12. The method of claim 1, wherein prior to the step of receiving the tachometer input, the read address, the write address, or combination thereof, the read address, the write address, or combination thereof is set to a default value.

13. The method of claim 12, wherein the default value is zero.

14. A cue delay circuit for a digital printing system, wherein the cue delay circuit comprises:

a. a memory element;

b. a first circuitry group adapted to create a write address and a read address for the memory element, respectively;

c. a sequence circuit adapted to control a timing associated with reading and writing of the read address and the write address of the memory element; and d. a second circuitry group adapted to verify that the read address of the memory element has been written to.

15. The cue delay circuit of claim 14, wherein the first circuitry group comprises:

a. an adder adapted to create a difference between the write address and the read address;

b. a multiplexer adapted to switch between the read address and the write address; and c. a counter.

16. The cue delay circuit of claim 14, wherein the sequence circuit is a member of the group consisting of a state machine, a binary counter, a shift register, a microcontroller, a monostable delay circuit, and combinations thereof.

17. The cue delay circuit of claim 14, wherein the second circuitry group comprises a comparator, a flip flop, and a gate circuit.

* * * * *